United States Patent [19]

Ko

[11] Patent Number: 5,200,367
[45] Date of Patent: Apr. 6, 1993

[54] METHOD FOR ASSEMBLING PACKAGES OF SEMI-CONDUCTOR ELEMENTS

[75] Inventor: Jun S. Ko, Seoul, Rep. of Korea

[73] Assignee: Gold Star Electron Co., Ltd., Rep. of Korea

[21] Appl. No.: 787,484

[22] Filed: Nov. 6, 1991

[30] Foreign Application Priority Data

Nov. 13, 1990 [KR] Rep. of Korea ............... 18359/1990

[51] Int. Cl.$^5$ .......................................... H01L 21/60
[52] U.S. Cl. .................................. 437/216; 437/209; 437/217; 174/52.4
[58] Field of Search ............... 437/216, 209, 217, 218, 437/219; 174/52.4

[56] References Cited

U.S. PATENT DOCUMENTS

| | | | |
|---|---|---|---|
| 4,172,261 | 10/1979 | Tsuzuki et al. | 357/81 |
| 4,663,833 | 5/1987 | Tanaka et al. | 437/209 |
| 4,761,518 | 8/1988 | Butt et al. | 437/217 |
| 4,769,344 | 9/1988 | Sakai et al. | 437/216 |
| 4,812,420 | 3/1989 | Matsuda et al. | 437/209 |
| 4,827,082 | 5/1989 | Horiuchi et al. | 174/52.4 |
| 4,833,102 | 5/1989 | Byrne et al. | 437/218 |
| 4,857,483 | 8/1989 | Steffen et al. | 437/209 |
| 4,903,119 | 2/1990 | Ito et al. | 357/72 |
| 4,971,930 | 11/1990 | Fusaroli et al. | 437/217 |
| 4,994,411 | 2/1991 | Naito et al. | 437/219 |

OTHER PUBLICATIONS

Tummala, et al., Microelectronics Packaging Handbook, "Plastic Packaging Process," Van Nostrand Reinhold Publ., pp. 637-638.
Kyocera Catalog, Ceramic Package, pp. 2-3.
Seraphim, Principles of Electronic Package, Chapter 10, McGram Hill, pp. 282-332.

*Primary Examiner*—Brian E. Hearn
*Assistant Examiner*—Kevin M. Picardat

[57] ABSTRACT

A method for assembling multilayer packages of semiconductor elements comprising double molding of the multilayer structure. The method comprises the steps of primarily molding inner leads of a lead frame, secondarily molding the inner leads to form a desired package, and performing in turn die bonding, wire bonding, trimming and forming processes. The double molding process is performed by using an inexpensive molding compound, thereby obtaining packages having a structure equivalent to that of expensive ceramic packages. Accordingly, the manufacture cost of packages is inexpensive and the assembling process is simplified.

4 Claims, 8 Drawing Sheets

METHOD FOR ASSEMBLING PACKAGES OF SEMI-CONDUCTOR ELEMENTS

BACKGROUND OF THE INVENTION

The present invention relates to a method for assembling packages of semi-conductor elements. Currently, packages of semi-conductor elements are classified into two general types, plastic packages and ceramic packages. Different processes are used to assemble each type of package. To help better understand the current art in the assembly of packages of semi-conductor elements, each process will be explained in detail below.

The first process to be described is that for assembling a plastic package. FIGS. 1a to 1f help describe this process, while FIG. 1g shows the finished plastic package.

Wafer 1 in FIG. 1a, which has been prepared to receive electrodes by a diffusion treatment, is subjected to a dicing process and divided into chips 2, also known as "dies." The dicing process may be accomplished by several means, including a chemical method using acetic acid or fluoroacetic acid, and a scribing method using a diamond cutter.

After the dicing process, die bonding is carried out, so as to attach a chip 2 to a paddle 4 of a previously prepared lead frame 3. This is shown in FIG. 1b. Here, the die 2 may also be called a "pellet", while the die bonding process may be called "pellet bonding" or "pellet mount". The paddle 4 is also called a "stem".

In the drawings, the lead frame 3 also comprises locking holes 5, lead fixing means or dambers 6, side rails 7, support bars 8 and leads 9. Each of the leads 9 includes an inner lead 9a and an outer lead 9b.

To accomplish the die bonding, an eutectic alloy process may be used. To do so, a gold-antimony alloy is thinly coated on paddle 4. With the die 2 then seated on the coated gold-antimony alloy layer, paddle 4 is heated. Through this heating, the gold-antimony alloy is eutectic-welded into the silicon material of the die 2. The heating temperature may be as high as 300° C. to 400° C., depending upon the kind of solder materials used. In order to avoid the oxidation of die 2 or paddle 4 under this high temperature, the heating is generally carried out in an atmosphere of inert gas such as nitrogen.

Other die bonding processes may be used, including use of a conductive epoxy based adhesive, a soldering process using a conventional Pb-Sn solder, and a glass soldering process. In the glass process, soldering glass is disposed on a substrate and melted at a temperature of about 500° C. to 600° C. A ceramic die pack is then pressure bonded on the melted soldering glass.

After the die bonding, a wire bonding process is performed, as shown in FIG. 1c. The wire bonding process connects bonding pads 10 of the die 2 with inner leads 9a of the lead frame 3 by means of wires 11. The wires are usually made of aluminum or gold. To accomplish the wire bonding process, one may use a thermal pressure bonding process, an ultrasonic process, a soldering process, a laser process or an electron beam process. The thermal pressure bonding process and the ultrasonic process are preferred in actual practice.

The above description relates to an in-line process of packages. Now, a back-end process will be described.

The lead frame 3, to which the die 2 and wires 11 have been bonded, is positioned in a die mold 12, as shown in FIG. 1d. Next, an epoxy molding compound is charged into the mold 12 and die molded. As shown in FIG. 1e, a trimming process is then performed to cut the lead fixing means or dambers 6, which were formed for the purpose of maintaining a uniform space between adjacent leads 9 of the lead frame 3. Thereafter, a forming process is carried out, so as to form the outer leads 9b into a preferred shape. After the forming process, the outer leads 9b may have a gull-wing shape, as shown in FIG. 1f, or a J-bend shape. The completed plastic package is shown in FIG. 1g.

A ceramic package is assembled in a similar manner. Ceramic packages are mainly classified into CERDIP (CERAMIC + DIP) type packages and multilayer type packages. Herein, the process for assembling a multilayer type ceramic package will be described. FIGS. 2a through 2e will be used to help illustrate this procedure, while FIG. 2f shows the finished ceramic package.

First, several sheets are prepared by using powder obtained by mixing an $Al_2O_3$ compound with certain additives. On respective sheets, patterns are formed which are to be used in respective layers of the package. In the forming of these patterns, metal pads of leads which are to be wirebonded with the bonding pads of the die are also formed. Together with a lead frame previously prepared, the sheets are stacked in turn and then subjected to sintering so as to form a package 13 of the desired shape as shown in FIG. 2a. The ceramic package 13 takes its shape through the use of three layers, that is a bottom layer 14, a middle 15 and a top layer 16. Of course, the ceramic package 13 may have more layers.

Subsequent processes are the same as those in assembling the plastic package. That is, die bonding is carried out, as shown in FIG. 2b, to attach a die (or a chip) 17 on a paddle of the lead frame (not shown). Then, wires 18 are bonded to the die and each corresponding lead, so as to connect them as shown in FIG. 2c. In order to cover the open portion of the package 13, a glass layer 19 is then formed, as shown in FIG. 2d.

Unless the obtained package is used for manufacturing an optical element, a metal layer may be formed in place of the glass layer 19. However, ceramic packages are mainly used in the manufacture of CCDs (Charge Coupled Devices) adapted to operate by receiving light, so glass layers are the norm.

Thereafter, leads 20 are attached to predetermined positions on both sides of the package 13, as shown in FIG. 2e.

FIG. 2f reveals the structure of the finally obtained step-shaped package.

The above-mentioned conventional methods of assembling packages for semi-conductor elements, while capable of creating useable packages, have the following disadvantages.

First, although the manufacturing cost of plastic packages is inexpensive by virtue of using cheap materials in their manufacture, the process itself is complex. In addition, by performing a molding process after the wire bonding process, movement of wires may occur. Consequently, the rate of poor products is increased.

Second, although ceramic packages are advantageously used in products requiring a high degree of accuracy, since the die bonding and wire bonding are carried out after the formation of packages, the cost of manufacturing ceramic packages is quite high.

OBJECTIVES OF THE INVENTION

Therefore, it is an object of the present invention to overcome the above-mentioned disadvantages encountered in the prior art and to provide a method of assembling packages of semi-conductor elements wherein a double molding process is used, thereby simplifying the assembly process and reducing the manufacturing cost.

SUMMARY OF THE INVENTION

In accordance with the present invention, this object is accomplished through a method for assembling a package of semi-conductor elements, comprising the steps of: primarily molding a portion of the inner leads of a previously prepared lead frame while leaving unmolded the portion of said inner leads to be wire bonded, so as to maintain the inner leads at fixed, relative positions; secondarily molding the inner leads by using a die mold, so as to form a step-shaped package in which the upper portion of the package is open and the portion of the inner lead to be wire bonded is exposed through the open upper portion; bonding a die on a paddle of said lead frame and then bonding wires between respective exposed inner leads and the bonding pads of the die; forming a lid to cover the open upper portion of the package; and then performing a trimming process adapted to remove lead fixing dambers of the lead frame and a forming process adapted to shape outer leads of the package to a desired shape.

Other objects and aspects of the invention will become apparent from the following description of embodiments and claims.

DETAILED DESCRIPTION OF THE INVENTION

In the following description, the present invention will be described in conjunction with FIGS. 3a to 3f illustrating the manufacture of dual in-line packages. Of course, the present invention is not limited thereto.

Some steps of the conventional processes described above are incorporated in the complete process according to the present invention. Thus, for simplicity, their detailed descriptions will be omitted from the following description.

Figure 1A:
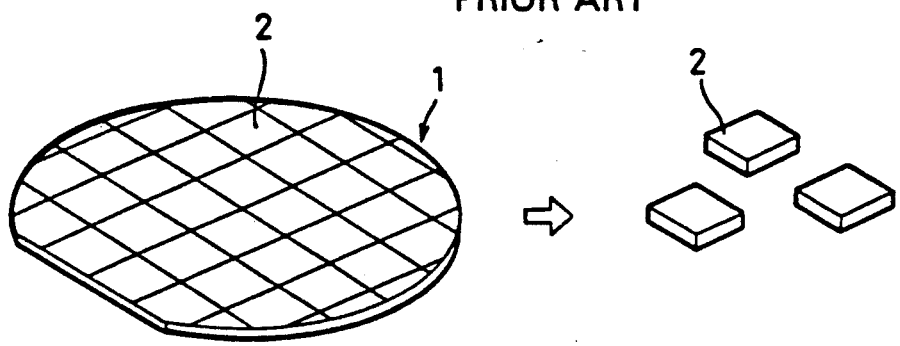
FIGS. 1a to 1f are views illustrating processes for assembling a plastic package in accordance with the prior art.
Figure 1B:
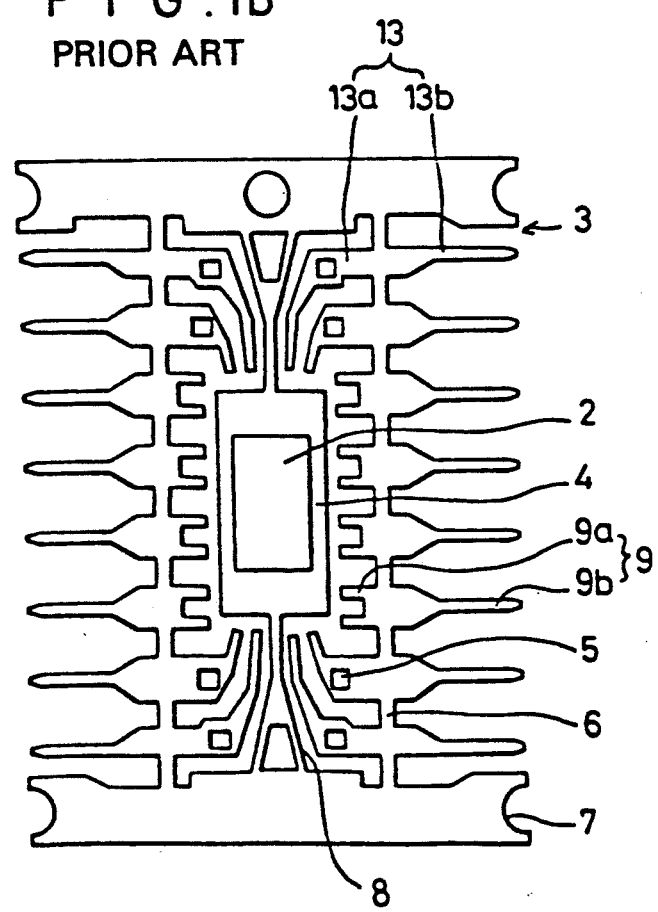
Figure 1C:
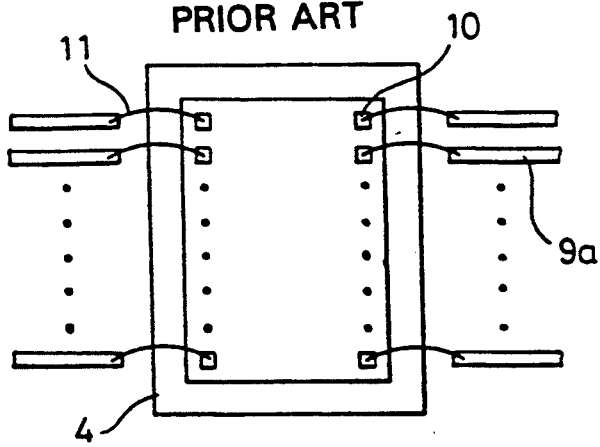
Figure 1D:
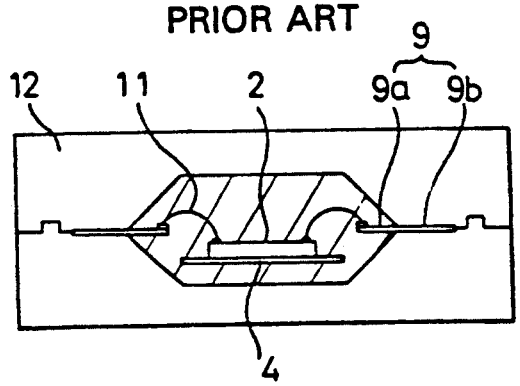
Figure 1E:
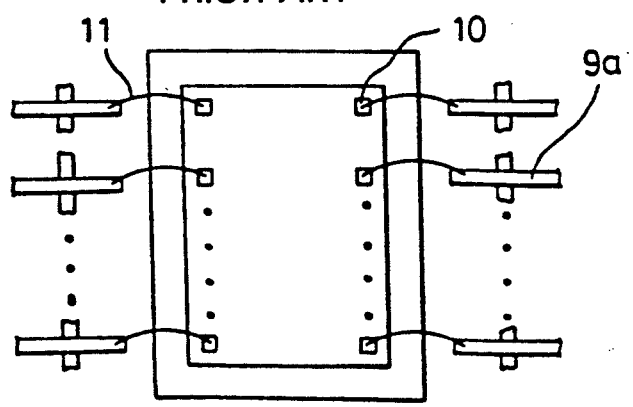
Figure 1F:
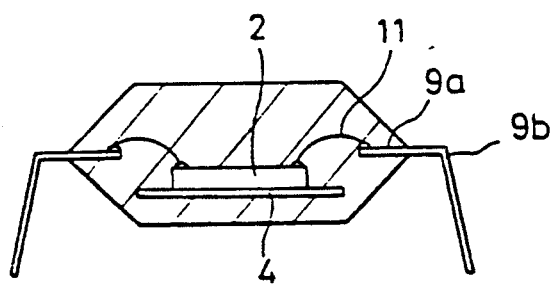
Figure 1G:
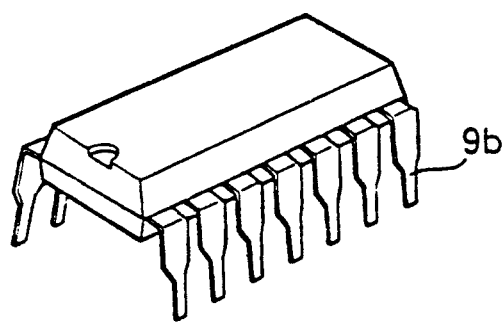
FIG. 1g is a perspective view of a plastic package produced by the prior art.
Figure 2A:
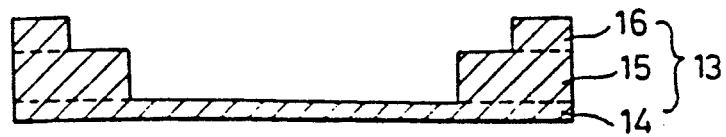
FIGS. 2a to 2e are views illustrating processes for assembling a ceramic package having a multilayer structure in accordance with the prior art.
Figure 2B:
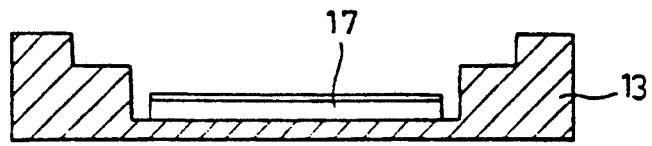
Figure 2C:
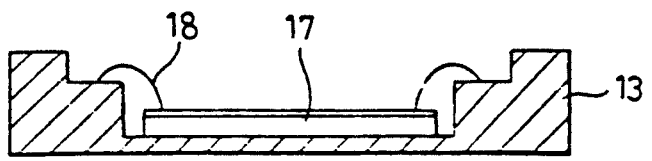
Figure 2D:
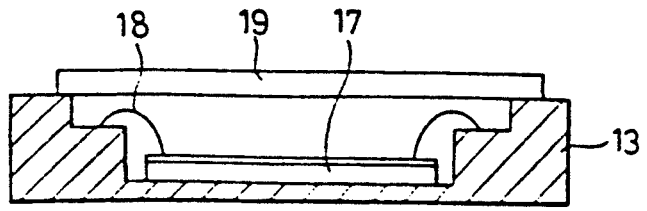
Figure 2E:
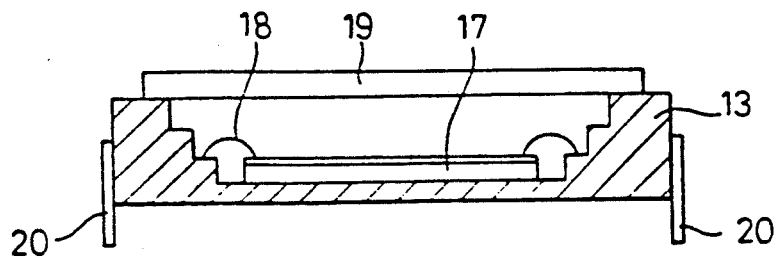
Figure 2F:
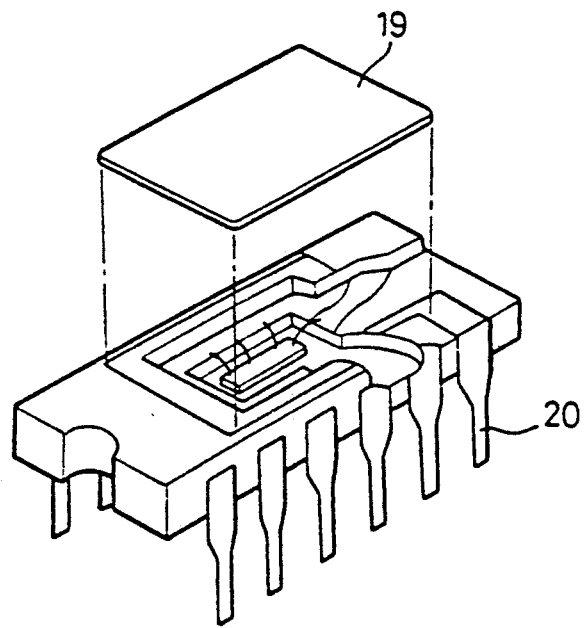
FIG. 2f is a perspective view of a ceramic package produced by the prior art.
Figure 3A:
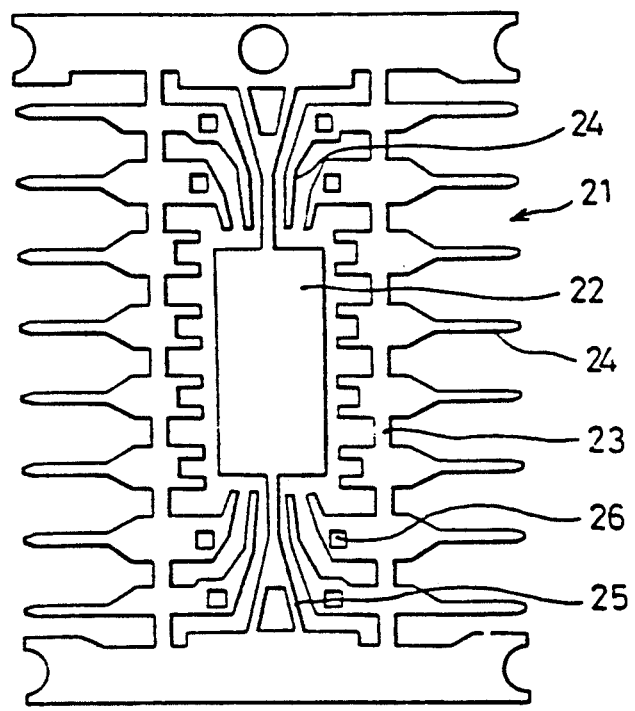
FIGS. 3a to 3f are views illustrating processes for assembling a package in accordance with the present invention.

First, a lead frame 2l suitable for use in the present invention is prepared, as shown in FIG. 3a. As described in conjunction with FIG. 1b, the lead frame 21 comprises a paddle 22 on which a die can be seated, lead fixing means or dambers 23 adapted to maintain a uniform space between adjacent outer leads 24a and firmly support them, leads 24 comprised of outer leads 24a and inner leads 24b, support bars 25 adapted to support the paddle 22 fixed on the lead frame 21, and locking holes 26.

Figure 3B:
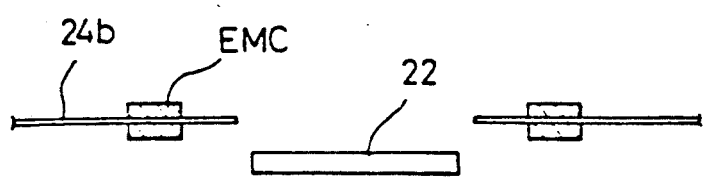

Next, a portion of inner leads 24b called the molded portion is primarily molded with an epoxy molding compound (EMC), as shown in FIG. 3b. The portion of inner leads 24b positioned nearest the paddle 22 is not subject to this first epoxy molding compound and therefore is called the non-molded portion. These primary moldings act to ensure that a uniform space and level is maintained between adjacent inner leads 24b, regardless of external impact.

Figure 3C:
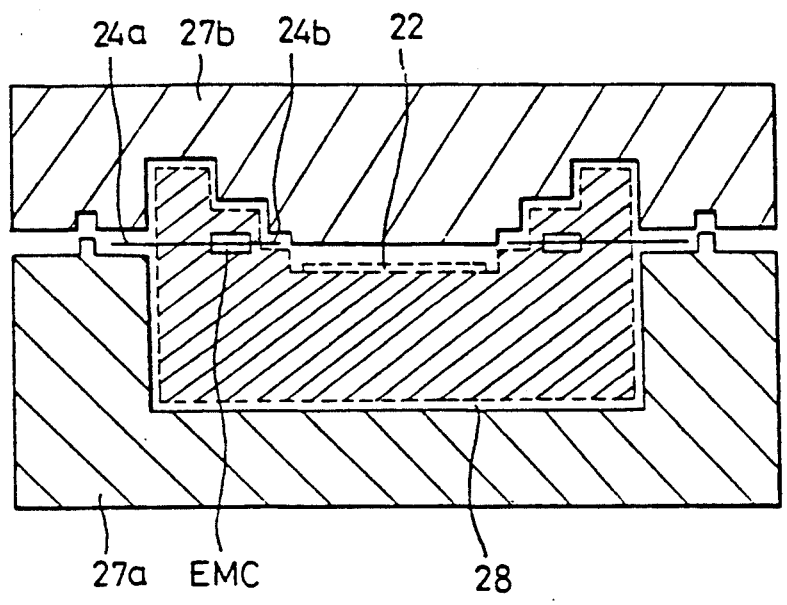

The lead frame 21 is then positioned on a lower die mold 27a manufactured to conform to a desired package shape, as shown in FIG. 3c. Over the lead frame 21, an upper die mold 27b is positioned. Thereafter, a second epoxy molding compound is injected into a cavity 28 defined between lower die mold 27a and upper die mold 27b, so as to form a package 29 having a desired shape.

At this time, the non-molded portion of inner leads 24b, adapted to connect with bonding pads on the die, are only partially molded by the second epoxy molding compound, so that the non-molded portions are exposed at the surface of the package. These non-molded portions of the inner leads have the same function as that of the patterns for wire bonding in a conventional ceramic package.

Figure 3D:
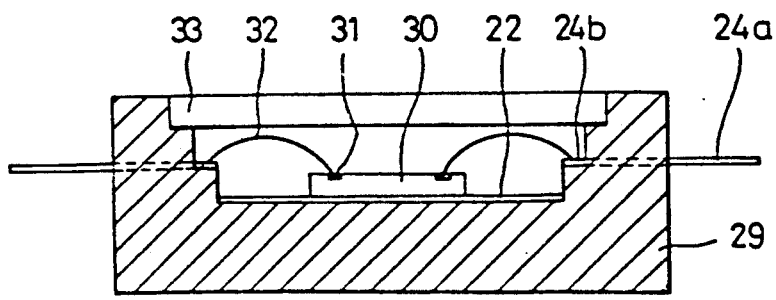
Figure 3E:
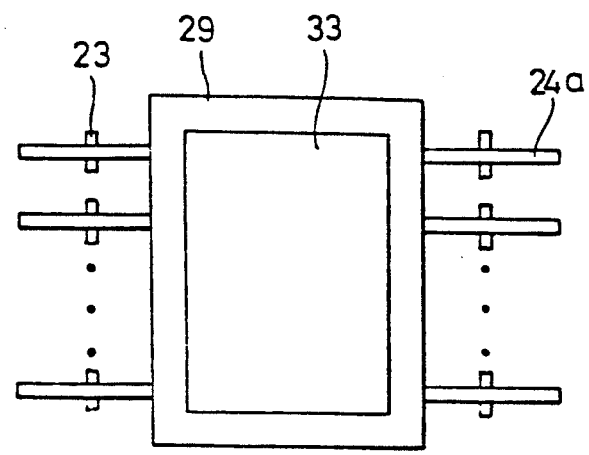
Figure 3F:
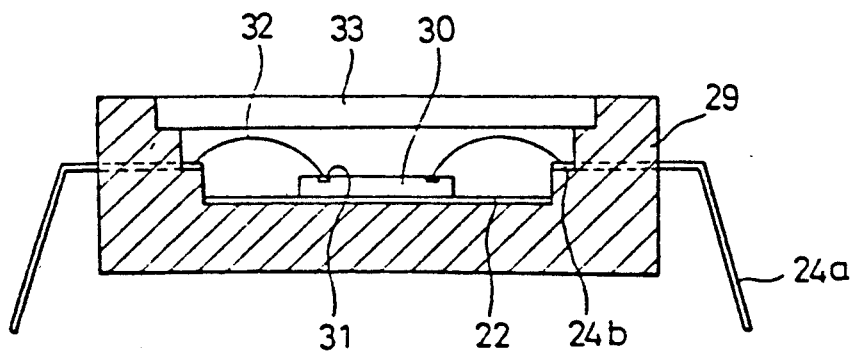

Thereafter, as shown in FIG. 3d, a die 30 is die-bonded on the paddle 22 in a conventional manner as described above. The non-molded portions of the inner leads 24b and the bonding pads 31 of the die 30 are bonded together by means of wires 32 in a conventional manner as described above. The open upper portion of the package is then covered with a lid 33 of glass or metal. Finally, a trimming process for removing the lead fixing means or dambers 23 is performed, as shown in FIG. 3e, as well as a forming process for shaping outer leads 24a into a certain shape, as shown in FIG. 3f.

As apparent from the above description, the method of the present invention provides the following effects:

first, the manufacture of packages is more economical than ceramic packages, in that a double molding process is performed by using an inexpensive molding compound, thereby obtaining packages having a structure equivalent to that of expensive ceramic packages;

second, the assembling process is simplified; and third, the rate of poor products is considerably lower than that of plastic packages, in that spaces among leads are uniformly maintained by the primary molding and in that the die bonding and the wire bonding are performed after the formation of the packages.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for assembling a package of semi-conductor elements, comprising the steps of:

primarily molding inner leads of a lead frame previously prepared for manufacturing each of said packages, except for a part of said inner leads to be wire bonded, so as to maintain the inner leads at a certain state;

secondarily molding the inner leads by using a die mold, so as to form a package of a step shape in which a portion of each remaining inner lead is exposed at a surface of the package and an upper portion of the package is open;

bonding a die on a paddle of said lead frame and then bonding wires between respective exposed inner leads and a bonding pad of the die;

forming a covering lid on the open upper portion of the package; and performing a trimming process to remove lead fixing dambers of a lead frame and performing a forming process to shape outer leads of the package to a desired shape.

2. A process for assembling packages of semi-conductor elements including the steps of:
 a) first creating a lead frame having a paddle, a plurality of lead fixing means, and a plurality of leads each having an inner lead and outer lead, the inner leads having a molded and non-molded portion,
 b) then molding the molded portions of the inner leads with an epoxy molding compound such that the inner leads maintain fixed positions relative to each other,
 c) next molding a step-shaped package having an open top around the inner leads through the use of a die mold which leaves the non-molded portions of the inner leads uncovered,
 d) afterwards, bonding a die having a plurality of bonding pads to the paddle,
 e) then bonding a plurality of wires between the bonding pads of the die and the non-molded portions of the inner leads, and
 f) finally covering a open top of the step-shaped package with a lid, trimming the lead fixing dambers and forming the outer leads to a desired shape.

3. A method according to claim 1, wherein molding of the inner leads is effected with an epoxy molding compound.

4. A method according to claim 2, wherein molding of the inner leads is effected with an epoxy molding compound.

* * * * *